United States Patent [19]

DeMeester et al.

[11] Patent Number: 4,780,675
[45] Date of Patent: Oct. 25, 1988

[54] CONJUGATE SYMMETRY MAGNETIC RESONANCE IMAGING

[75] Inventors: Gordon D. DeMeester, Wickcliffe; John L. Patrick, Solon; G. Neil Holland, Chagrin Falls, all of Ohio

[73] Assignee: Picker International, Inc., Highland Hts., Ohio

[21] Appl. No.: 85,956

[22] Filed: Aug. 14, 1987

[51] Int. Cl.⁴ .......................................... G01R 33/20
[52] U.S. Cl. .................................... 324/312; 324/309
[58] Field of Search ...................... 324/307, 309, 312; 364/726, 571

[56] References Cited

U.S. PATENT DOCUMENTS

| | | | |
|---|---|---|---|
| 4,684,891 | 8/1987 | Feinberg | 324/307 |
| 4,689,567 | 8/1987 | Maudsley | 324/309 |
| 4,694,251 | 9/1987 | Yoshitome et al. | 324/309 |
| 4,728,893 | 3/1988 | Feinberg | 324/309 |
| 4,733,188 | 3/1988 | Sekihara et al. | 324/309 |
| 4,740,748 | 4/1988 | Rzedzian | 324/309 |

OTHER PUBLICATIONS

"Faster MR Imaging: Imaging with Half the Data", by Margosian, et al., Health Care Instrumentation, vol. 1, No. 6, 1986, pp. 195–197.
"Faster MR Imaging—Imaging with Half the Data", by Paul Margosian, Society of Magnetic Resonance in Medicine, 4th Annual Meeting, Aug. 19–23, 1986, London, pp. 1024–1025.
"Field Inhomogeneity Correction and Data Processing for Spectroscopic Imaging", by Maudsley, et al., Magnetic Resonance in Medicine, 2, 1985, pp. 218–233.
"Direct Fourier Transform NMR Tomography with Modified Kumar-Welti-Ernst (MKWE) Method", by Song, et al., IEEE Transactions on Nuclear Science, vol. NS-29, No. 1, Feb. 1982.
"Magnetic Field Measurement by NMR Imaging", by Maudsley, et al., The Institute of Physics, 1982p. 216–220.
"A New Method of Measuring Static Field Distribution Using Modified Fourier NMR Imaging", by Sekihara, et al., The Institute of Physics, 1985, pp. 224–227.
"RARE Imaging: A Fast Imaging Method for Clinical MR", by Henning, et al., Mag. Res. in Medicine, 3, pp. 823–833 (1986).
"Phase Encoded, Rapid, Multiple Echo (PERME) Nuclear Magnetic Resonance Imaging", by Lawton, Aug. 1985.
"Exploiting the Stimulated Echo in NMR Imaging", by Sattin, for NVR, Picker Clinical Science Center, vol. 2, No. 1, Feb. 1987, pp. 18–21.

Primary Examiner—Stewart J. Levy
Assistant Examiner—Kevin D. O'Shea
Attorney, Agent, or Firm—Fay, Sharpe, Beall, Fagan, Minnich & McKee

[57] ABSTRACT

An incomplete set of magnetic resonance image data is collected and stored in a view memory (40). The incomplete set of image data includes a central or first set of data values (42, 42') and a side or second set of data values (44, 44'). The central data set is operated on by a roll-off filter (64) and a Fourier transform (66) to create a normalized phase map (72). The first and second data sets are Fourier transformed (82) and phase corrected (86) by being multiplied with a complex conjugate (88) of the corresponding phase map data value. A third data set (46, 46') is generated (90) by determining the complex conjugate of the second or side data set. The third data set is Fourier transformed (94) and multiplied (98) by a corresponding value from the phase map to produce a second phase corrected image representation. The first and second phase corrected image representations are summed (100) and stored in a resultant image memory (102).

20 Claims, 2 Drawing Sheets

CONJUGATE SYMMETRY MAGNETIC RESONANCE IMAGING

BACKGROUND OF THE INVENTION

The present invention relates to the magnetic resonance art. It finds particular application in conjunction with Fourier transforms imaging and will be described with particular reference thereto. It is to be appreciated, however, that the present invention may also find application in other imaging and spectroscopy techniques in which only a partial or incomplete data set is available.

Heretofore, medical diagnostic magnetic resonance imaging has included the sequential pulsing of radio frequency signals and magnetic field gradients across a region to be imaged. In two dimensional imaging, a patient is disposed in a region of interest in a substantially uniform main magnetic field. An RF excitation pulse is applied as a slice select gradient is applied across the field to select a slice or other region of the patient to be imaged. A phase encode gradient is applied along one of the axes of the selected slice to encode material with a selected phase encoding. In each repetition of the pulse sequence, the phase encode gradient is stepped in regular intervals from a negative maximum phase encode gradient through a zero phase encode gradient to a positive maximum phase encode gradient. Theoretically, the pair of views corresponding to positive and negative phase encode gradients have a symmetric relationship. However, in practice have a symmetric relationship is rendered unpredictable by sequence and field dependent phase considerations in order to overcome these difficulties, conventionally both positive and negative phase encode views are collected in order to form a phase independent magnitude image.

Magnetization manipulation pulses are applied to cause a magnetic resonance echo. During the echo following each pulse sequence, one set of data points, generally termed a view or step, is sampled. The data points within each view correspond to a preselected range of frequencies $fo \pm \Delta f$, where $fo$ is the frequency of the center data value of the view. For the zero phase encoding view, a datum frequency $fo + \Delta f_1$ is realted to that of $fo - \Delta f_1$. The data values for a positive phase encode view corresponding to a frequency $fo + \Delta f_1$ are also related to the corresponding negative phase encode view at frequency $fo - \Delta f_1$ by conjugate symmetry. In this manner, each data point in a full data set, sometimes referred to as k space, is related to another point by the underlying property of conjugate symmetry. The complete set of views is operated on by a two dimensional inverse Fourier transform to derive an image representation.

Others have reconstructed images utilizing only half a set of views, i.e. only the positive views or only the negative views. In one such half data reconstruction, about eight additional views were collected adjacent the zero or minimum phase encoding. The sixteen central views about the zero phase encoding were utilized to derive a phase map. The acquired data was filtered and the data set was completed by filling with zeros. The Fourier transform of this data set was then phase corrected by the phase map to yield the final reconstruction. However, this technique produced less than satisfactory images which were particularly sensitive to artifacts caused by motion-induced errors in phase.

The present invention provides a new and improved technique for reconstructing images with less than a full set of data.

SUMMARY OF THE INVENTION

In accordance with the present invention, a method and apparatus are provided for magnetic resonance imaging. In the method aspect of the invention, an incomplete data set is acquired where the peak datum is either not centered in the phase encode or not centered in the frequency direction. The acquired data is used to generate three complex images. One complex image, a phase map, is the result of filtering the data in the neighborhood of the peak completing the data with zeros and doing an inverse Fourier transform to give a complex image of magnitude one. The second complex image is the result of filtering or not the acquired data and doing the inverse Fourier transform. The third complex image is the result of using the conjugate symmetry relation to complete an appropriate data set, filtering or not, zeroing the acquired data, and doing the inverser Fourier transform. The phase map is then used to correct the second and third complex images before they are summed together for the final image. The real, imaginary, or magnitude of this final image is then displayed.

In accordance with the apparatus aspect of the invention, means are provided for performing each of the foregoing steps.

In accordance with a more limited aspect of the present invention, a method of magnetic resonance imaging with less than a complete data set is provided. Phase encoded magnetic resonance views are collected for (i) a generally centrally phase encoded set of views and (ii) half of the remaining views. A phase map is constructed from the centrally encoded views. The non-collected views are synthesized from the acquired views by conjugate symmetry. The collected views are Fourier transformed to form a first image respresntation and the synthesized views are Fourier transformed to form a second image representation. The phase of the first and second image represenations is adjusted in accordance with the phase map and the phase adjusted image representations are summed to form a resultant image.

In accordance with a still more limited aspect of the present invention, views representing one of the positive and negative sets of phase encodings are acquired and views of the other are synthesized.

In accordance with another apsect of the present invention, the step of generating a phase map from the centrally phase encoded views includes operating on the centrally phase encoded views with a roll-off filter such that the centrally phase encoded views roll-off toward zero.

In accordance with another more limited aspect of the present invention, the symmetric properties of the acquired data in the frequency encode direction are utilized analogously. That is, the monitored resonance frequency has a frequency range of $\times f$ about a central frequency $fo$. For each phase encode gradient, partial signal views are acquired which include just over half the frquency samples. A phase map is generated from the data adjacent the central frequency $fo$. The non-acquired frequency components are synthesized from the acquired frequency components. The actually acquired data and the synthesized data are separately transformed to form first and second image representations which are phase corrected in accordance with the phase map. The phase corrected image representations are sumed to form a resultant image representation.

One advantage of the present invention is that it can be used to reduce the data collection time by reducing the number of phase encoded views.

Another advantage of the present invention is an improved NMR sequence capability by selecting slightly more than half the echo to sample.

Another advantage of the present invention is that it improves the resultant image.

Still further advantages will become apparent to those of ordinary skill in the art upon reading and understanding the following detailed description.

BRIEF DESCRIPTION OF THE DRAWINGS

The invention may take form in various steps and arrangements of steps and in various components and arrangements of components. The drawings are only for purposes of illustrating a preferred embodiment and are not to be construed as limiting the invention.

DETAILED DESCRIPTION OF THE PREFERRED EMBODIMENT

Figure 1:
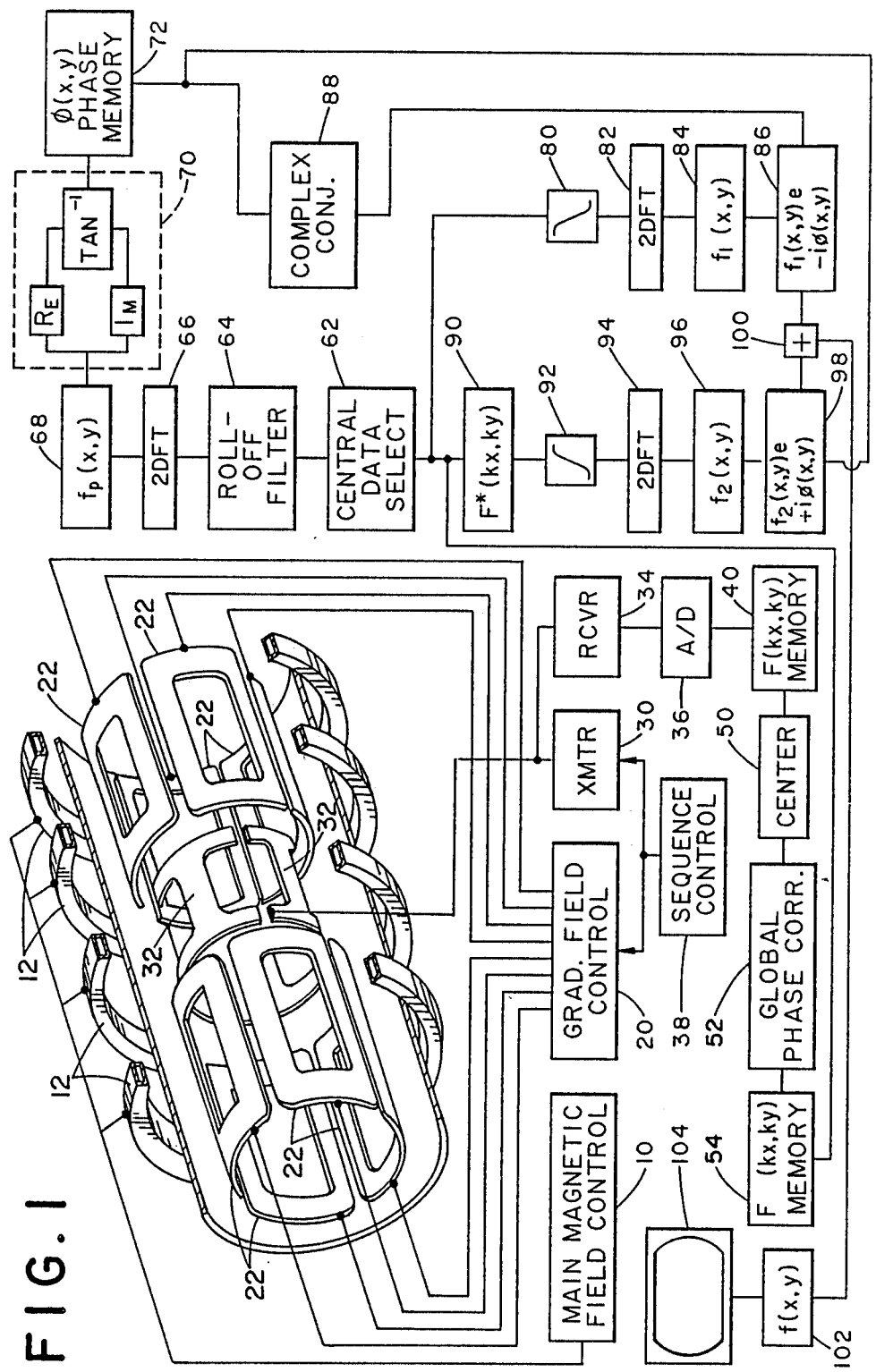
FIG. 1 is a diagrammatic illustration of a magnetic resonance imaging apparatus in accordance with the present invention.

With reference to FIG. 1, nuclear spin of hydrogen in an image region of a magnetic resonance imaging apparatus are excited to magnetic resonance. More specifically, a main magnetic field means, including a main magnetic field controller 10 and a plurality of electromagnets 12, generates a substantially uniform, main magnetic field through the image region. In a superconducting magnet, the controller 10 is only used to ramp up to field or down. A gradient field control means 20 selectively controls the application of gradient fields across the main magnetic field by gradient field coils 22. By selectively applying current pulses to appropriate ones of the gradient field coils, slice select, phase encode, and read gradients are selectively applied along mutually orthogonal axes. The slice select gradients define an image slice or region and the phase encode and read gradients encode the magnetic resonance along mutually orthogonal axes with the slice.

A transmitter 30 selectively applies radio frequency pulses to RF coils 32 to excite dipoles in the image region to magnetic resonance and to manipulate or orient the magnetization of the resonating dipoles. Magnetic resonance signals generated by the resonating dipoles, particularly when the magnetization is refocused into an echo. are received by the RF coils 32. A radio frequency receiver 34 demodulates the received radio frequency signals to a bandwidth of fo±Δf, where the center frequency fo of the bandwidth or spectrum ±Δf is preferably zero.

The received magnetic resonance signals are quadrature detected then digitized by an analog-to-digital converter 36 with the digitized signals from each echo commonly being denoted as a view or line of data. A timing and control means 38 controls the timing and application of the gradient and radio frequency pulses to perform spin echo, gradient echo, inversion recovery, and other imaging sequences as are well known in the art.

In a single slice spin echo imaging sequence, for example, the gradient field control means 20 applies a slice select gradient to change the magnetic field strength as a function of position along the main magnetic field. The transmitter 20 generates a radio frequency magnetic resonance excitation pulse to excite magnetic resonance between the spin system and the RF field. Thereafter, the spin system relaxes, during which only the magnetization is away from the main magnetic field axis. The gradient field control means encodes the resonating data along mutually orthogonal axes within the slice by applying slice select and phase encode gradient pulses. The radio frequency transmitter 30 then applies an inversion pulse to caussse diverging or dephasing magnetization vectors of the excited resonance to converge and form an echo. The magnetic resonance signal generated during the echo is received by the receiver 34 which filters out frequency components outside of the selected slice and heterodynes the received data to the bandwidth±Δf about the preselected central frequency fo. The data is digitized to form a first view or line of data. The imaging sequence is repeated additional lines of data which are stored in an acquired view memory 40. Although the preferred embodiment is described in terms of single slice imaging, it is to be appreciated that the invention is also applicable to volume imaging, multi-slice imaging, and the like.

Figure 2:
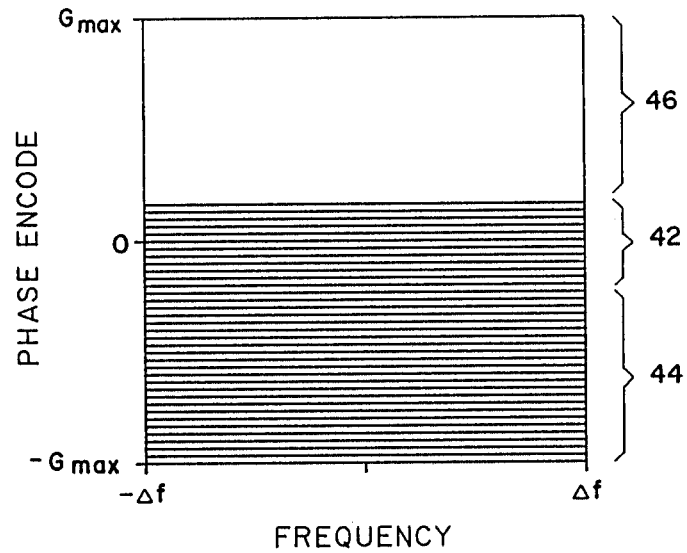
FIG. 2 is a graphic representation to assist in conceptualizing synthesizing additional views by conjugate symmetry; and, FIG. 3 is a graphic representation to assist in conceptualizing frequency spectrum data expansion by conjugate symmetry.

With reference to FIG. 2, each view is commonly identified by the value fo the phase encoding gradient with which the resonace data is encoded. Commonly, a preselected number of views, e.g. 256 views, corresponding to phase encode gradients that vary in like steps from $-Gmax$ to $+Gmax$ are generated by repeating the imaging sequence with different phase encode gradients. Each view or data line is frequency encoded by the read gradient pulse and includes a plurality of frequency components. The frequency component in the center of each view should be fo, those at one extreme $fo-\Delta f$ and those at the other extreme $fo+\Delta f$. A datum value at a frequency $fo+\Delta F_1$ of a positive phase encode view is related by conjugate symmetry to a datum value at a frequency $fo-\Delta f_1$ of the corresponding negative phase encode view. For the zero phase encode view, the datum values are symmetric about fo.

In the preferred embodiment, the imaging sequence is repeated to collect data over a contiguous phase encoded central set of views 42 surrounding the zero or minimum phase encode gradient. Data for side views 44 are also acquired for half of the remaining views, preferably the contiguous views between the central views 42 and either $-Gmax$ or $+Gmax$. The side views 46 between the central views and the other of $\pm Gmax$ are not acquired. Rather, as described below, this data is synthesized from the acquired data using the symmetry properties of the data.

Figure 3:
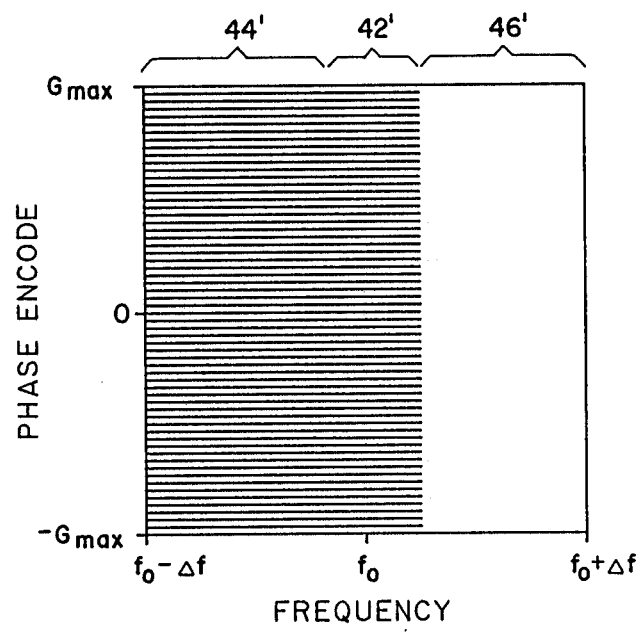

With reference to FIG. 3, a full set of partial views for $-Gmax$ to $+Gmax$ may be acquired but which views are incomplete. Specifically, each view includes data in a central frequency region 42' about the fo or center frequency of the views. Data from a first peripheral region 44' between the central region and one of the $\pm\Delta f$ frequencies is acquired. The peripheral data 46' between the central region and the other of the $\pm\Delta f$ limit of views is not acquired. The not acquired fraction of the data is again synthesized from the symmetric properties of the magnetic resonance data.

The fractional data set described above in conjunction with FIGS. 2 or 3 or combinations thereof is stored in the view memory 40. A centering means 50 centers the data. For spin echo or gradient echo imaging, the magnitude of the acquired data is maximum at the center of the data set, i.e. the datum value acquired with the zero or minimum phase encoding angle and with the zero or fo center frequency. The data within the view memory 40 is shifted such that the center data value whether determined by its large magnitude or otherwise is moved to the memory coordinate corresponding to a zero phase angle and fo frequency. This may involve shifting data lines up or down or left to right. Any data lines or portion of data lines for which there is no data are filled with zeros.

Optionally, an amplitude correction may be made in the frequency direction to correct for T2 decay. A global phase correction means 52 may perform a phase correction on all the acquired data to compensate or correct for possible T2 decay. However, the same phase correction information is in the phase map discussed below. If the global phase correction is performed, it is preferably of the form:

$$F_{corr}(kx,ky) = \frac{Fo^*(0,0)}{|Fo(0,0)|} Fo(kx,ky), \tag{1}$$

where Fo(kx,ky) is the centered data and Fo*(0,0) is the complex conjugate of the central datum value of the data set. The acquired data which has been centered and which may also have been T2 amplitude and globally phase corrected is stored in a corrected acquired data memory means 54 or returned to the view memory 40.

A phase map reconstructing means 60 reconstructs a phase map from the central data portion 42, 42' of the data as acquired. More specifically, a central data selecting means 62 selects the largest available matrix of data which is centered on the zero phase view, e.g. a 32×256 data matrix centered at (0,0). The remainder of the data values, such as the remainder of a 256×256 array, is loaded with zeros. A roll-off filter means 64 rolls-off the data values of the selected centermost matrix smoothly to the loaded zeroes. Various roll-off filters may be utilized such as a Hanning filter, a Hamming filter, or the like. The roll-off filter provides a smooth transition from the actually collected data to the surrounding zeros and eliminates any discontinuities which might cause ringing or artifacts. A two dimensional Fourier transform means 66 performs an inverse Fourier transform on the filtered data to construct a phase map, e.g. a 256×256 array of complex data values fp(x,y). The phase map may be either the complex number phase of the resultant complex image or the complex image normalized to a magnitude of 1.0. A phaes determining means 70 determines the phase of each of the complex data values of the 256×256 matrix for storage in a phase memory 72, such as a 256×256 memory. The values for the phase memory 72 may be determined by calculating the arctangent of the real and imaginary parts of each data value. Alternately, the phase determining means may normalize each complex data value such that it becomes a vector of unit length which is stored in the phase memory means 72.

The actually collected data from the first and second regions 42 and 44 or 42' and 44' is filtered with a roll-off filter 80, such as a Hamming filter, to ramp down the data past zero in the first region 42. The filtered data is inverse Fourier transformed by a two dimensional Fourier transform means 82 to form a first image representation f1(x,y) which is stored in a first image representation memory means 84. A first phase correction means 86 phase corrects the first image representation in accordance with the phase information in phase memory means 72. More specifically, a phase correction complex conjugate means 88 calculates the complex conjugate of each value in the phase memory means 72. For example, the complex conjugate of the unit vector $e^{\phi(x,y)}$ is $e^{-1\phi(x,y)}$. The phase correction means 86 multiplies each (x,y) value of the first image representation by the complex conjugate of the value in the phase memory means 72 for the corresponding (x,y) position. In the preferred embodiment, the correction is of the form:

$$f1(x,y)e^{-i\phi(x,y)}. \tag{2}$$

A complex conjugate means 90 generates a third data set corresponding to side data values in region 46, 46' by calculating the complex conjugate for each corresponding data value (kx, ky) of the collected side data values in region 44, 44'. A filter means 92 ramps up the symmetrized data at a rate that is the complement of the filter 80. A Fourier transform means 94 performs an inverse, two dimensional Fourier transform on the complex conjugate data to create a second image representation f2(x,y) for storage in a second image representation memory 96. A second phase correction means 98 corrects each data value of the second image represenation in accordance with the phase of the corresponding (x,y) point from the phase memory 72. In a preferred embodiment, the second phase correction is of the form:

$$f2(x,y)e^{i\phi(x,y)}. \tag{3}$$

In this manner, the first and second correction means 86, 98 perform a phase correction in which the resultant data or image representation is corrected with a phase map generated from the same data. Utilizing the same data to create the phase map protects against the introduction of phase errors which might arise if different data were utilized such as data from a subsequent scan or subsequent echo of the scan.

An adding means 100 sums the phase corrected first and second image representations in a complex addition process to create a resultant or composite image representation f(x,y) for storage in a resultant image memory 102. The resultant image is, of course, a complex image in which each image data value is a complex number having a real and imaginary part. A display means 104 is operatively connected with the resultant image memory means 102 to display the real component of the resultant image, the imaginary component, or combinations thereof. Other data storage means and image representation enhancement circuitry may, of course, be interconnected with the resultant image memory means 102.

The invention has been described with reference to the preferred embodiments. Obviously, modifications and alterations will occur to others upon reading and understanding the preceding detailed description. It is intended that the invention be construed as including all suh alterations and modifications insofar as they come within the scope of the appended claims or the equivalent thereof.

Having thus described the preferred embodiments, the invention is now claimed to be:

1. A method of magnetic resonance imaging comprising:
   (a) exciting magnetic resonance of nuclei in an image region;
   (b) after each excitation of magnetic resonance, causing a magnetic resonance echo during which a magnetic resonance echo signal is generated;
   (c) applying a phase encode gradient between a maximum positive gradient and a maximum negative phase encode gradient such that the resultant magnetic resonance echo signal is phase encoded in accordance with the phase encode gradient;
   (d) quatradure detecting and digitizing the magnetic resonance signal to create a view of digial data values;
   (e) repeating steps (a), (b), (c), and (d) with each of a plurality of phase encode gradients centered around a central phase encode gradient to create centrally encode data values;
   (f) repeating steps (a), (b), (c), and (d) with each of a plurality of phase encode gradients to create actually collected side data values between the central data values and a view corresponding to one of the maximum positive and negative phase encode gradients;
   (g) generating a phase map from the centrally encoded data values;
   (h) generating a set of synthesized data values corresponding to non-collected views between the central data values and a view corresponding to the other of the maximum positive and negative phase encode gradients from the collected side data values;
   (i) Fourier transforming the central and the collected side data values to form a first image representation;
   (j) determining complex conjugate values from the phase map and correcting each data value of the first image representation with the complex conjugate of a corresponding value of the phase map to create a phase corrected first image representation;
   (k) Fourier transforming the synthesized data values to create a second image representation;
   (l) phase correcting the second image representation in accordance with corresponding values from the phase map; and,
   (m) combining the first and second phase corrected image representations.

2. A method of magnetic resonance imaging comprising:
   (a) exciting magnetic resonance in an image region;
   (b) after each excitation of magnetic resonance, causing a magnetic resonance echo during which a magnetic resonance echo signal is generated;
   (c) applying a phase encode gradient such that the resultant magnetic resonance echo signal is phase encoded in accordance with the phase encode gradient;
   (d) collecting a central portion of the magnetic resonance echo signal surrounding a central frequency and a side portion of the magnetic resonance signals between the central portion and one extreme of a resonance signal bandwidth;
   (e) digitizing the collected magnetic resonance echo signal portions to create digital central and side data values;
   (f) repeating steps (a), (b) (c), (d), and (e) with each of a plurality of phase encode gradients;
   (g) generating a phase map from the central data values;
   (h) generating a set of synthesized data values corresponding to frequencies between the central frequency portion and an opposite extreme of the bandwidth from the collected side data values;
   (i) Fourier transforming the central and side data values to form a first image representation;
   (j) determining comples conjugate values of the phase map and correcting each data value of the first image representation with the complex conjugate of a corresponding value of the phase map to create a phase corrected first image representation;
   (k) Fourier transforming the synthesized data values to create a second image representation;
   (l) phase correcting the second image representation in accordance with corresponding values from the phaes map; and,
   (m) combining the first and second phase corrected image representations.

3. A method of magnetic resonance imaging comprising:
   generating magnetic resonance data including a first set of centrally encoded data values and a second set of data values which includes half of the remaining data values;
   generating a phase map from the first data value set;
   generating a conjugately symmetric third data set from the second data set;
   Fourier transforming the first and second data value sets;
   phase correcting the Fourier transformed first and second data sets in accordance with the phase map;
   Fourier transforming the third data set;
   phase correcting the Fourier transformed third data set in accordance with the phase map;
   combining the phase corrected, Fourier transformed data sets to produce an image representation.

4. The method as set forth in claim 3 further including prior to the phase map generating step, the step of centering and aligning the data values of the first and second sets.

5. The method as set forth in claim 3 wherein the step of generating the phase map includes:
   filtering the first set of data values to provide a smooth transition between the first set of data values and zero data values therearound; and,
   performing a two dimensional Fourier transform on the filtered first set of data values and surrounding zeros to form a phase map.

6. The method as set forth in claim 5 wherein the phase map generating step further includes normalizing complex data values of the phase map to determine the relative phase.

7. The method as set forth in claim 6 wherein phase correcting the Fourier transformed first and second data sets includes combining the data values with complex conjugates of the normalized phase map values.

8. The method as set forth in claim 7 wherein the step of phase correcting the Fourier transformed third data set includes combining the data values with the normalized phase map data values.

9. The method as set forth in claim 3 wherein the step of phase correcting the Fourier transformed first and second data sets includes operating on the data sets with complex conjugates of phase map values; and wherein the step of phase correcting the Fourier transformed third data set includes operating on the Fourier transformed third data set with phase map values.

10. The method as set forth in claim 3 wherein the step of generating the first data set includes generating a plurality of magnetic resonance echoes which are phase encoded around a minimum phase encode gradient and digitizing the magnetic resonance echo signals to create the first data set.

11. The method as set forth in claim 10 wherein the step of generating the second set of data values includes creating magnetic resonance echo signals which are phase encoded with phase encode gradients between the central phase encode gradients and one of a positive and negative maximum phase encode gradient.

12. The method as set forth in claim 3 wherein the step of generating the first set of data values includes causing magnetic resonance echoes during each of which magnetic resonance echo signals having a preselected bandwidth and bandwidth center frequency are generated, components of the magnetic resonance echo signal adjacent the central frequency being digitized to form the first set of data values.

13. The method as set forth in claim 12 wherein the step of generating the second set of data values includes digitizing magnetic resonance echo signal components between the central frequency components and one extreme of the bandwidth.

14. A method of magnetic resonance imaging comprising:
acquiring an incomplete data set in which a peak datum value is off set in one of a phase encode direction and a frequency direction;
generating a phase map including:
filtering the acquired data set in a neighborhood of the peak datum value,
completing a filtered acquired data set with zeroes,
inverse Fourier transforming the completed data set to give a complex phase map image with unit magnitude;
generating an acquired data image by inverse Fourier transforming the acquired data set;
generating a symmetric at image including:
creating a symmetric data set which completes the incomplete data set by using a conjugate symmetry relationship therebetween,
inverse Fourier transforming the symmetric data set to generate the symmetric data image;
correcting the acquired and symmetric images with the phase map image;
summing the phase map corrected acquired and symmetric images to create a complex resultant image; and,
displaying at least one of a real, imaginary, and magnitude component of the resultant image.

15. A magnetic resonance imaging apparatus comprising:

magnetic resonance data means for generating a first set of centrally encoded data values and a second set of data values which includes half of the remaining data values;
a phase map generating means for generating a phase map from the first data value set;
a conjugate symmetry means for generating a third data set from complex conjugate values of the second data set;
a Fourier transform means for Fourier transforming the first and second data sets to create a first image representation and the third data set to create a second image representation;
a phase correcting means for phaes correcting the first and second image representations in accordance with the phase map; and,
a combining means for combining the phase corrected first and second image representations to create a resultant image.

16. The apparatus as set forth in claim 15 further including a display means for displaying the resultant image.

17. The apparatus as set forth in claim 15 wherein the magnetic resonance data generating means includes:
means for exciting magnetic resonance of dipoles in an image region;
means for inducing magnetic resonance echoes during which magnetic resonance echo signals are generated;
means for applying magnetic field gradients across the image region for phase and frequency encoding the magnetic resonance signals; and,
an analog-to-digital converter for digitizing the magnetic resonance echo signals to create digital sets of data values.

18. The apparatus as set forth in claim 15 further including:
a memory means for storing a grid of data values, including the first and second data value sets; and,
a centering means for centering the first data value set in the memory means.

19. The apparatus as set forth in claim 15 wherein the phase map generating means includes:
a filter means for operating on the first data set with a two dimensional roll-off filter;
a Fourier transform means for performing a two dimensional Fourier transform operation on the filtered first data set; and,
a phase map memory means for storing the phase map.

20. The apparatus as set forth in claim 15 wherein the phase correcting means includes:
a complex conjugate means for determining a complex conjugate of the phase map; and,
a multiplying means for multiplying Fourier transformed data sets by one of the phase map and the complex conjugate of the phase map.

* * * * *